(12) United States Patent
Tomiyasu et al.

(10) Patent No.: US 8,188,564 B2
(45) Date of Patent: May 29, 2012

(54) SEMICONDUCTOR DEVICE HAVING A PLANARIZING FILM FORMED IN A REGION OF A STEP PORTION

(75) Inventors: Kazuhide Tomiyasu, Osaka (JP); Yutaka Takafuji, Osaka (JP); Yasumori Fukushima, Osaka (JP); Kazuo Nakagawa, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 64 days.

(21) Appl. No.: 12/743,226

(22) PCT Filed: Jul. 24, 2008

(86) PCT No.: PCT/JP2008/001981
§ 371 (c)(1),
(2), (4) Date: May 14, 2010

(87) PCT Pub. No.: WO2009/084125
PCT Pub. Date: Jul. 9, 2009

(65) Prior Publication Data
US 2010/0252906 A1 Oct. 7, 2010

(30) Foreign Application Priority Data
Dec. 27, 2007 (JP) ................. 2007-336836

(51) Int. Cl.
*H01L 27/12* (2006.01)
(52) U.S. Cl. ......... 257/506; 257/E27.112; 257/E21.602; 257/206; 257/347; 257/350; 257/72; 257/E21.32; 257/354; 438/26

(58) Field of Classification Search .............. 257/506, 257/E27.112, E21.602, 206, 347, 350, 72, 257/E21.32, 354; 438/26
See application file for complete search history.

(56) References Cited

U.S. PATENT DOCUMENTS

| | | | |
|---|---|---|---|
| 2004/0048203 A1 | 3/2004 | Furusawa et al. | |
| 2004/0183133 A1 | 9/2004 | Takafuji et al. | |
| 2005/0098827 A1* | 5/2005 | Kanegae | 257/347 |
| 2007/0229721 A1* | 10/2007 | Matsuda | 349/39 |
| 2007/0235734 A1 | 10/2007 | Takafuji et al. | |
| 2008/0164623 A1 | 7/2008 | Kanegae | |
| 2009/0269907 A1 | 10/2009 | Takafuji et al. | |

FOREIGN PATENT DOCUMENTS

| | | |
|---|---|---|
| EP | 1463105 A2 | 9/2004 |
| EP | 1531489 A2 | 5/2005 |
| JP | 2004-158821 A | 6/2004 |
| JP | 2004-288780 A | 10/2004 |
| JP | 2005-167197 A | 6/2006 |
| JP | 2006-344666 A | 12/2006 |

* cited by examiner

*Primary Examiner* — Marc Armand
(74) *Attorney, Agent, or Firm* — Birch, Stewart, Kolasch & Birch, LLP

(57) ABSTRACT

A method for manufacturing a semiconductor device including a thin film device unit including a TFT, and a peripheral device unit provided around the thin film device unit and including a semiconductor element, includes a first step of preparing a substrate, a second step of bonding the peripheral device unit directly to the substrate, and a third step of forming the thin film device unit on the substrate to which the peripheral device unit is bonded.

3 Claims, 8 Drawing Sheets

SEMICONDUCTOR DEVICE HAVING A PLANARIZING FILM FORMED IN A REGION OF A STEP PORTION

TECHNICAL FIELD

The present invention relates to methods for manufacturing semiconductor devices, and semiconductor devices.

BACKGROUND ART

In recent years, as a technique relating to display apparatuses, a so-called monolithic liquid crystal display (hereinafter also referred to as a "system liquid crystal display") has attracted attention in which peripheral device units, such as a drive circuit unit, a control circuit unit, and the like, are integrated with a pixel unit. In a semiconductor device used in such a system liquid crystal display, a switching element for the pixel unit, and the peripheral device unit are simultaneously formed on the same substrate, whereby the number of parts can be significantly reduced. Moreover, steps of assembling and inspecting the liquid crystal display can be reduced. Therefore, the manufacturing cost can be reduced, and the reliability can be improved.

For display apparatuses such as liquid crystal display apparatuses and the like, there is a strong demand for higher performance, such as lower power consumption, and higher definition and a faster response time of image display. There is also a demand for smaller space occupied by the peripheral device unit, and integration of higher-level systems (a memory, a signal processing circuit, etc.).

Therefore, for semiconductor devices used in display apparatuses, there is a strong demand for a still smaller size of each element, and the peripheral device unit requires submicrometer design rules, i.e., fine pattern accuracy at the integrated circuit (hereinafter also referred to as "IC") level so that a larger number of elements are formed in a limited area. For semiconductor elements constituting the peripheral device unit, there is also a demand for a higher mobility of carriers in a semiconductor layer. To meet this demand, the reduction in size of each element is also required.

However, in conventional manufacturing processes which form a semiconductor device directly on a glass substrate, the insufficient heat resistance of the glass substrate may lead to a distortion in the glass substrate in a thermal treatment of the manufacturing process, and therefore, a desired submicrometer circuit pattern may not be formed. Glass substrates used in manufacture of liquid crystal display apparatuses, such as system liquid crystal displays and the like, are becoming larger, resulting in an in-plane distortion in the glass substrate being more likely to occur during the manufacturing process.

In contrast to this, there is a technique of using a silicon-on-insulator (SOI) substrate in which an integrated circuit is formed in a monocrystalline silicon layer provided on an electrical insulator, and transferring a peripheral device unit onto a substrate of a liquid crystal display. With this method, conventional IC chip fabricating processes can be used to form an integrated circuit including semiconductor elements. Therefore, a semiconductor device including a minute and high-performance integrated circuit which has a desired submicrometer circuit design can be achieved. However, when the peripheral device unit is transferred onto the substrate, then if a surface of the substrate on which the transfer is performed is not flat, it is difficult to reliably attach the peripheral device unit to the substrate.

To address such a problem, as described in, for example, Patent Document 1, a technique has been studied and developed for forming gate electrodes of the pixel unit, removing an insulating film and a sacrificial film, by etching, from a region in which a peripheral device unit is to be provided, and attaching a semiconductor device having semiconductor elements to the region. With this technique, the microroughness of the glass surface is reduced by performing etching using an etchant which provides a selectivity ratio with respect to the glass substrate when the sacrificial film is removed. Moreover, it is considered that the bonding strength after the transfer is satisfactorily high compared to a process in which the sacrificial film is not formed (only the insulating film is removed by etching to expose the glass surface).

CITATION LIST

Patent Document

PATENT DOCUMENT 1: Japanese Patent Laid-Open Publication No. 2004-158821

SUMMARY OF THE INVENTION

Technical Problem

However, in the aforementioned method of forming gate electrodes of a pixel unit, removing an insulating film and a sacrificial film, by etching, from a region in which a peripheral device unit is to be provided, and attaching a semiconductor device including semiconductor elements to the region, it is necessary to provide a step of forming the sacrificial film, resulting in a problem with manufacturing efficiency. Moreover, after the etching, warpage of the glass substrate is likely to occur due to residue or the like of the sacrificial film on the glass surface, or a thermal treatment, resulting in an adverse influence on the bonding strength between the glass substrate and the peripheral device unit.

Solution to the Problem

The present invention has been made in view of the aforementioned problems. It is an object of the present invention to provide a semiconductor device manufacturing method and a semiconductor device which have a satisfactorily high manufacturing efficiency and bonding strength between the substrate and the peripheral device unit.

A method according to the present invention is for manufacturing a semiconductor device including a thin film device unit including a TFT, and a peripheral device unit provided around the thin film device unit and including a semiconductor element. The method includes a first step of preparing a substrate, a second step of bonding the peripheral device unit directly to the substrate, and a third step of forming the thin film device unit on the substrate to which the peripheral device unit is bonded.

A semiconductor device according to the present invention includes a substrate having an insulating surface, a thin film device unit provided on the substrate, and a peripheral device unit provided on the substrate around the thin film device unit, and including a semiconductor element. The peripheral device unit is provided directly on the insulating surface of the substrate.

With such a configuration, the peripheral device unit is bonded directly to the glass substrate, and therefore, there is not a film or the like between the flat glass substrate and the peripheral device unit. Therefore, the glass substrate and the peripheral device unit are satisfactorily attached to each other. Moreover, because a sacrificial film or the like is not formed on the glass substrate, the manufacturing efficiency of the device is satisfactorily high. Moreover, because the peripheral device unit is bonded to the glass substrate before the thin film device unit is formed, there is not residue of a sacrificial film or the like on the glass substrate before the peripheral device unit is bonded to the glass substrate, and therefore, warpage due to a thermal treatment or the like does not occur. Therefore, the peripheral device unit can be bonded to a flatter surface of the glass substrate. As a result, the glass substrate and the peripheral device unit are more satisfactorily attached to each other.

Advantages of the Invention

According to the present invention, it is possible to provide a semiconductor device manufacturing method and a semiconductor device in which the manufacturing efficiency, and the bonding strength between the substrate and the peripheral device unit are satisfactorily high.

DESCRIPTION OF REFERENCE CHARACTERS

10 Liquid Crystal Display Apparatus
11, 111 Element Substrate
20, 120 Thin Film Device Unit
21 TFT
22, 122 Glass Substrate
23, 52 Semiconductor Layer
40, 140 Peripheral Device Unit
41, 141 Alignment Mark
42 MOS Transistor
160 Step Portion
161 Planarizing Film
163 Metal Interconnection

DESCRIPTION OF EMBODIMENTS

Embodiments of the present invention will be described hereinafter with reference to the accompanying drawings. Note that the present invention is not limited to the embodiments below.

First Embodiment

Figure 7:
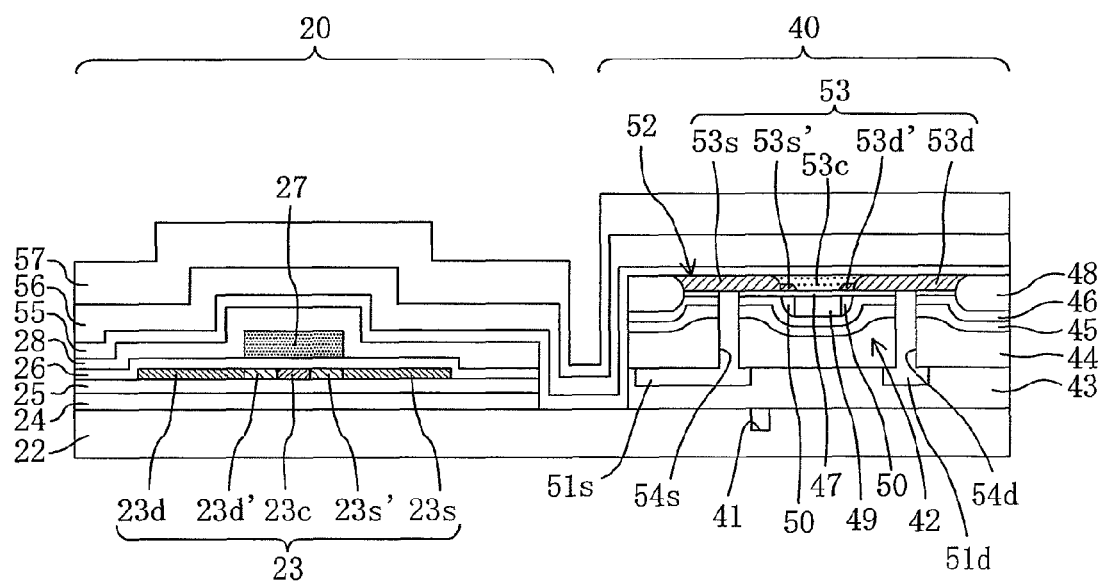
FIG. 7 is a cross-sectional view of the glass substrate on which a TEOS film is formed.
Figure 8:
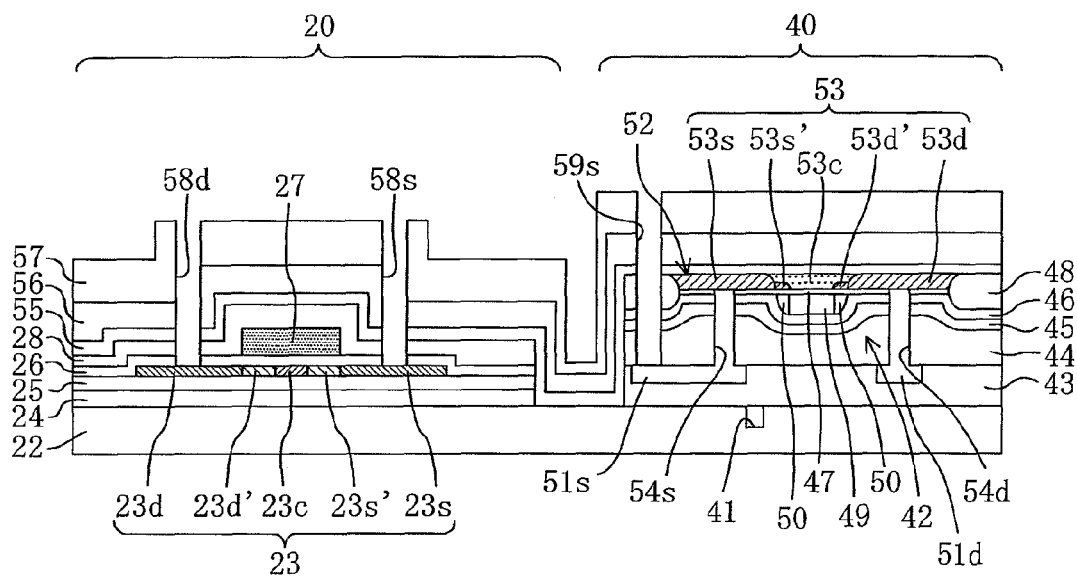
FIG. 8 is a cross-sectional view of the glass substrate on which contact holes are formed.
Figure 9:
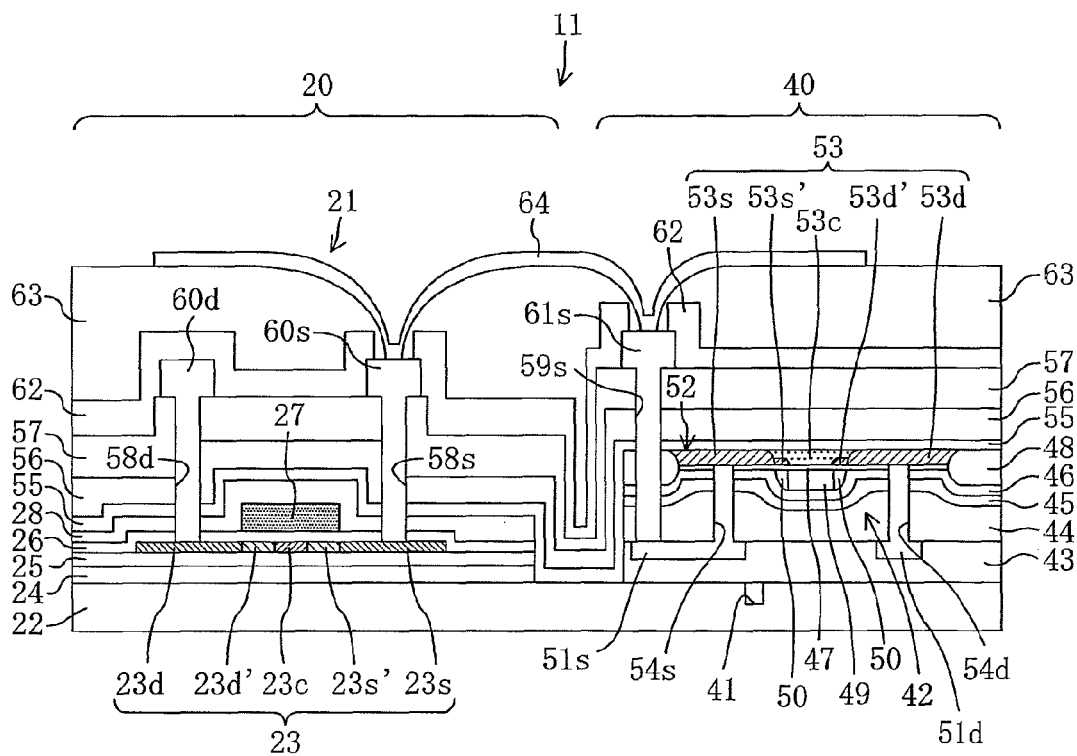
FIG. 9 is a cross-sectional view of an element substrate according to the first embodiment.
Figure 10:
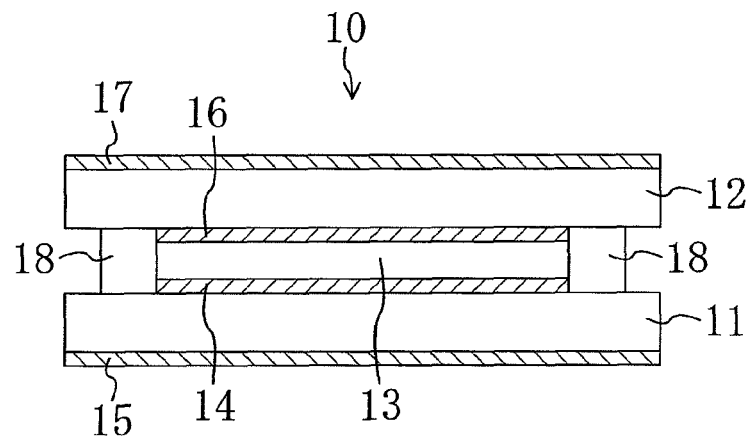
FIG. 10 is a cross-sectional view of a liquid crystal display apparatus according to the first embodiment.

FIGS. 1-10 show a first embodiment of the present invention. FIG. 10 is a diagram schematically showing a main portion of a liquid crystal display apparatus 10. FIG. 9 is an enlarged view of a main portion of an element substrate 11. FIGS. 1-9 are cross-sectional views for describing a method for manufacturing the element substrate 11 which is a semiconductor device.

As shown in FIG. 10, the liquid crystal display apparatus 10 includes the element substrate 11, a counter substrate 12 facing the element substrate 11, and a liquid crystal layer 13 formed therebetween.

As shown in FIG. 9, the element substrate 11 includes a thin film device unit 20. The thin film device unit 20 of the element substrate 11 includes a plurality of pixels (not shown), and thin film transistors (TFTs) 21 which are display elements formed for the respective pixels. An alignment film 14 is provided on a surface closer to the liquid crystal layer 13 of the element substrate 11, while a polarizing plate 15 is stacked on a surface farther from the liquid crystal layer 13 of the element substrate 11. A peripheral device unit 40 which drives and controls the TFTs 21 is provided on the element substrate 11 around the thin film device unit 20.

A color filter, a common electrode made of ITO, and the like are formed on the counter substrate 12, though not shown. Moreover, an alignment film 16 is provided on a surface closer to the liquid crystal layer 13 of the counter substrate 12, while a polarizing plate 17 is stacked on a surface farther than the liquid crystal layer 13 of the counter substrate 12. The liquid crystal layer 13 is enclosed by a sealing member 18 interposed between the element substrate 11 and the counter substrate 12. In the liquid crystal display apparatus 10 thus configured, the TFTs 21 are used to control the aligned states of liquid crystal molecules in the liquid crystal layer 13 to provide desired display.

The TFTs 21 are formed on a glass substrate 22 with base coat layers 24 and 25 being interposed therebetween. The glass substrate 22 is preferably made of barium-borosilicate glass, barium-aluminoborosilicate glass, alkaline earth-aluminoborosilicate glass, borosilicate glass, alkaline earth-zinc-lead-aluminoborosilicate glass, alkaline earth-zinc-aluminoborosilicate glass, or the like. The TFTs 21 each include a semiconductor layer 23 having an active region, a gate insulating film 26 covering the semiconductor layer 23, a gate electrode 27 provided on the gate insulating film 26, and a protective film 28 covering the gate electrode 27. The semiconductor layer 23 has a channel region 23c, lightly doped drain (LDD) regions 23s' and 23d' (both low-concentration impurity regions) formed on opposite sides of the channel region 23c, and a source region 23s and a drain region 23d (both high-concentration impurity regions) between which the channel region 23c and the LDD regions 23s' and 23d' are interposed. The semiconductor layer 23 is an amorphous silicon semiconductor layer or a polycrystalline silicon semiconductor layer.

As shown in FIG. 9, the peripheral device unit 40 is formed on a surface of the glass substrate 22 at a position corresponding to an alignment mark 41. The peripheral device unit 40 includes a MOS transistor 42 which is a semiconductor element. An insulating film 43 which is a first planarizing film, an interlayer insulating film 44 which is a second planarizing film, an interlayer insulating film 45, and an insulating film 46 are stacked in this stated order on the glass substrate 22. The insulating film 43 is attached to the surface of the glass substrate 22.

A surface of the insulating film 46 in the peripheral device unit 40 is concave toward the glass substrate 22. A gate oxide film 47 and a LOCOS oxide film 48 are formed on the surface of the insulating film 46. A gate electrode 49 and sidewalls 50 are formed between the gate oxide film 47 and the insulating film 46. The sidewalls 50 are formed on left and right side surfaces of the gate electrode 49, respectively.

A source electrode 51s and a drain electrode 51d are formed in the insulating film 43 at a boundary between the insulating film 43 and the interlayer insulating film 44.

A semiconductor layer 52 which is a monocrystalline silicon layer is formed on a surface of the gate oxide film 47. The semiconductor layer 52 is formed by forming a release layer by ion-implanting a release material into a semiconductor substrate, and then separating and removing a portion of the semiconductor substrate along the release layer.

An active region 53 is formed in the semiconductor layer 52. The active region 53 includes a channel region 53c, LDD regions (low-concentration impurity regions) 53c' and 53d' formed on left and right sides of the channel region 53c, respectively, and source and drain regions (high-concentration impurity region) 53s and 53d formed farther outside than the LDD regions 53c' and 53d', respectively. The LDD regions 53c' and 53d' and the source and drain regions 53s and 53d are doped with, for example, an N-type impurity, such as phosphorus or the like.

The channel region 53c faces the gate electrode 49 via the gate oxide film 47. The LDD regions 53c' and 53d' face the respective sidewalls 50 via the gate oxide film 47. The source electrode 51s is connected to the source region 53s via a contact hole 54s, while the drain electrode 51d is connected to the drain region 53d via a contact hole 54d.

A TEOS film 55, a SiN film 56, and a TEOS film 57 are formed as insulating films on the protective film 28 of the TFT 21 and the semiconductor layer 52 of the peripheral device unit 40. Contact holes 58s and 58d are formed which penetrate the TEOS film 55, the SiN film 56, the TEOS film 57, the protective film 28, and the gate insulating film 26 to reach the source region 23s and the drain region 23d of the semiconductor layer 23, respectively. A contact hole 59s is formed which penetrates the TEOS film 55, the SiN film 56, the TEOS film 57, the LOCOS oxide film 48, the interlayer insulating film 44, the interlayer insulating film 45, and the insulating film 46 to reach the source electrode 51s of the peripheral device unit 40. Interconnection portions 60d, 60s, and 61s made of a conductive material are formed in the contact holes 58d, 58s, and 59s, respectively.

A passivation film 62 is formed to cover the interconnection portions 60d, 60s, and 61s of the TFT 21 and the peripheral device unit 40. A resin film 63 made of an organic resin, an inorganic resin, a polyimide, or the like is formed as a planarizing film on the passivation film 62. A region where the resin film 63 is not formed is formed on each of the interconnection portions 60s and 61s, and a conductive film 64 made of ITO or the like is formed which extends over the region and a part of the resin film 63. The peripheral device unit 40 and the TFT 21 are electrically connected to each other via the conductive film 64.

Method for Manufacturing Device Substrate 11

Next, a method for manufacturing the element substrate 11 of the liquid crystal display apparatus 10 will be described.

Figure 1:
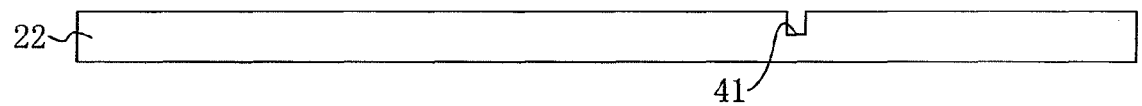
FIG. 1 is a cross-sectional view of a glass substrate according to a first embodiment on which an alignment mark is formed.

Initially, as shown in FIG. 1, the glass substrate 22 is prepared, and the alignment mark 41 is formed on a surface thereof, which is used for positioning when the peripheral device unit is formed. The alignment mark 41 may be formed by cutting the glass substrate 22, or by printing a resin material on the glass substrate 22.

In a separate step, the peripheral device unit 40 which is to be bonded to the glass substrate 22 is produced. Here, a method for manufacturing the peripheral device unit 40 will be described. Initially, a P-well region, and the LOCOS oxide film 48 and the gate oxide film 47 are formed in the semiconductor substrate which is a silicon substrate (corresponding to the semiconductor layer 52 before a portion thereof is separated).

Specifically, a thermal oxide film is formed on the semiconductor substrate, a P-type impurity element (e.g., boron) is ion implanted into the semiconductor substrate. Next, the semiconductor substrate is subjected to a thermal treatment so that the ion-implanted P-type impurity element is diffused and activated, thereby forming the P-well region.

Next, a silicon nitride film is formed and patterned on a surface of the thermal oxide film, and thereafter, the thermal oxide film and the semiconductor substrate are subjected to LOCOS oxidation, to form the LOCOS oxide film 48 on left and right sides of the silicon nitride film. Next, initially, the silicon nitride film and the thermal oxide film are removed, and thereafter, a thermal oxide film and the like are formed.

Next, a film made of a conductive material is stacked on a surface of the gate oxide film 47, and is then patterned by a photolithography method or the like, to form the gate electrode 49 on the semiconductor substrate.

Next, the active region 53 is formed in the P-well region of the semiconductor substrate. Initially, an N-type impurity element such as phosphorus or the like is ion implanted to form the N-type LDD regions 53c' and 53d'. Next, a SiO$_2$ film is formed on a surface of the gate oxide film 47 by CVD or the like, and is then subjected to etching, to form the sidewalls 50 on the opposite sidewalls of the gate electrode 49.

Next, an N-type impurity element such as phosphorus or the like is ion implanted using the gate electrode 49 and the sidewalls 50 as a mask to form the N-type source and drain regions 53s and 53d. Thereafter, the insulating film 46 made of SiO$_2$ or the like is formed, and thereafter, the LDD regions 53c' and 53d', the source region 53s, and the drain region 53d are subjected to a thermal treatment to activate the ion-implanted impurity element.

Next, the interlayer insulating film 45 is formed on a surface of the insulating film 46, and thereafter, a release material including H or an inert gas element, such as He, Ne, or the like, is ion implanted via the interlayer insulating film 45 to the P-well region of the semiconductor substrate. Thus, the release layer including the release material is formed in the semiconductor substrate.

Next, a SiO$_2$ film is formed to cover the semiconductor substrate and the interlayer insulating film 45, and is then planarized by chemical mechanical polishing (CMP) or the like, to form the interlayer insulating layer 44.

Next, the source electrode 51s and the drain electrode 51d are formed. Initially, the contact holes 54s and 54d penetrating the interlayer insulating film 44, the interlayer insulating film 45, the insulating film 46, and the gate oxide film 47 are formed. The contact hole 54s is formed above the source region 53s, while the contact hole 54d is formed above the drain region 53d. Thereafter, a conductive material is provided in the contact holes 54s and 54d and on a surface of the interlayer insulating film 44, and is then patterned. As a result, the source electrode 51s is formed above the contact hole 54s, while the drain electrode 51d is formed above the contact hole 54d. Next, the insulating film 43 is formed, and a surface thereof is then planarized by CMP or the like.

Next, the surface of the insulating film 43 is washed, and thereafter, the planarized surface is bonded to the glass substrate 22 in accordance with the alignment mark 41, and a thermal treatment is performed at a temperature of about 400-600° C. As a result, a portion of the semiconductor substrate including the P-well region is separated along the release layer, and thereafter, the MOS transistor 42 of the peripheral device unit 40 is transferred onto the glass substrate 22. Note that, in this embodiment, the semiconductor substrate a portion of which is separated in the separation step is referred to as the semiconductor layer 52.

Figure 2:
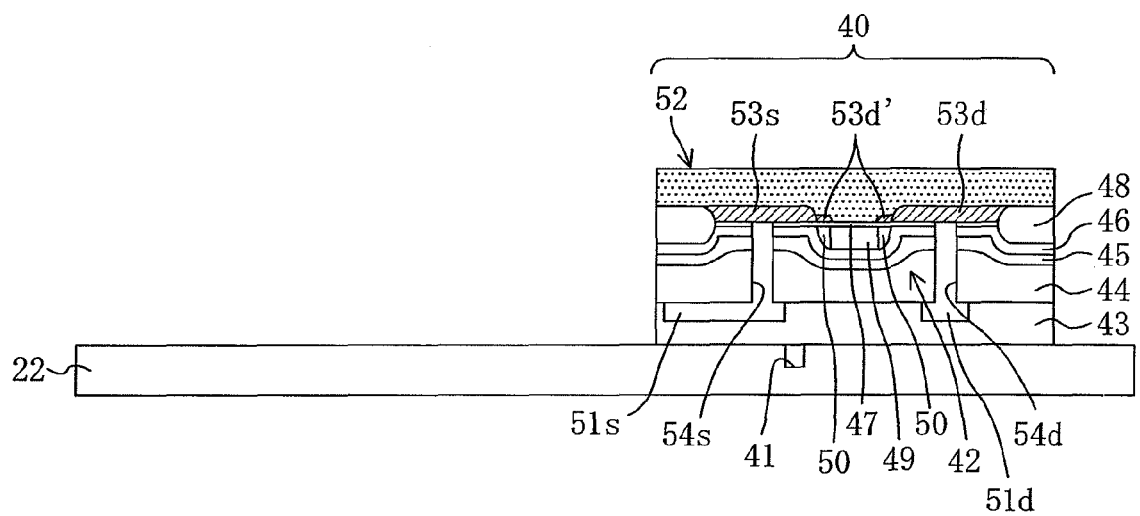
FIG. 2 is a cross-sectional view of the glass substrate to which a peripheral device unit is bonded.

Thus, as shown in FIG. 2, the peripheral device unit 40 is formed on the glass substrate 22 before the thin film device unit 20 is formed.

Figure 3:
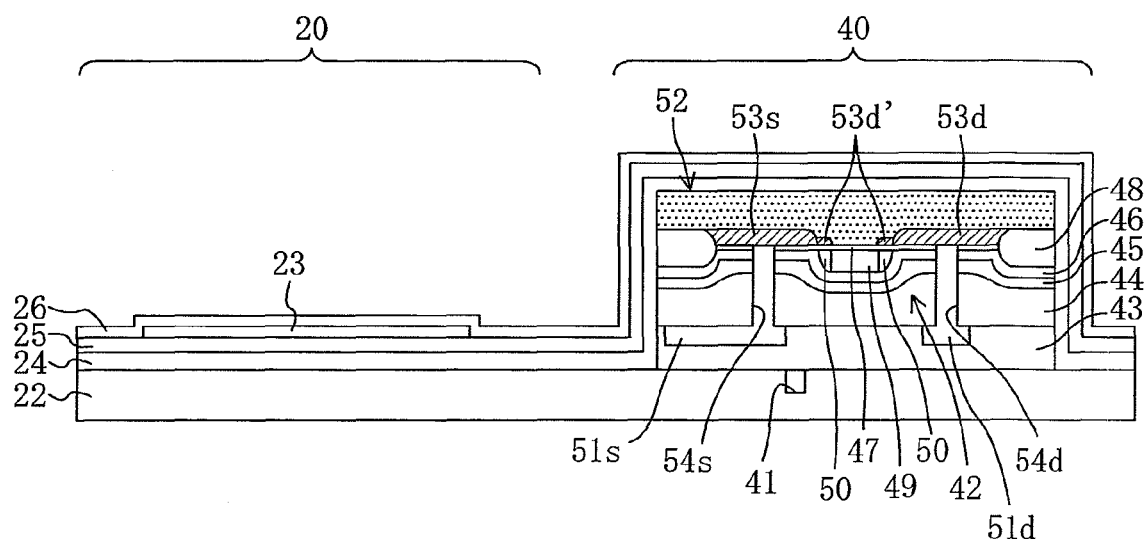
FIG. 3 is a cross-sectional view of the glass substrate on which a gate insulating film is formed.

Next, as shown in FIG. 3, the base coat layers 24 and 25 are formed on a display region of the glass substrate 22 and on the peripheral device unit 40 in a peripheral region of the glass substrate 22.

Next, the TFT 21 is formed in the display region of the base coat layer 25. Specifically, the semiconductor layer 23 is patterned on a surface of the base coat layer 25 by photolithography. In this case, if an alignment mark for formation of a thin film device is previously formed in the display region of the glass substrate 22, the TFT 21 can be formed with high accuracy.

Next, the gate insulating film 26 is stacked on the base coat layer 25 to cover the semiconductor layer 23.

Next, a mask is formed on a portion of the semiconductor layer 23 corresponding to a position where the channel region 23c is to be formed, and an impurity element is ion implanted, to form the channel region 23c and the low-concentration impurity regions on the opposite sides of the channel region 23c, in the semiconductor layer 23.

Figure 4:
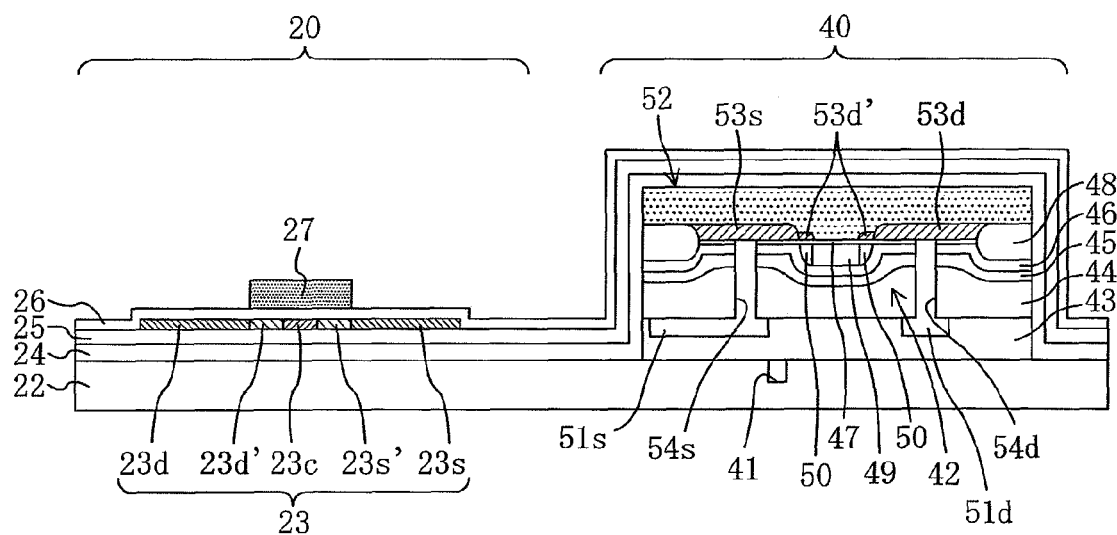
FIG. 4 is a cross-sectional view of the glass substrate on which a gate electrode is formed.

Next, the mask is removed. Thereafter, as shown in FIG. 4, the gate electrode 27 is formed by patterning using photolithography so that the gate electrode 27 overlaps the channel region 23c of the semiconductor layer 23 and a portion of the opposite sides of the channel region 23c. By ion implanting an impurity element into the semiconductor layer 23 using the gate electrode 27 as a mask, the LDD regions 23s' and 23d' and the source and drain regions 23s and 23d are formed so that the channel region 23c is interposed therebetween.

Figure 5:
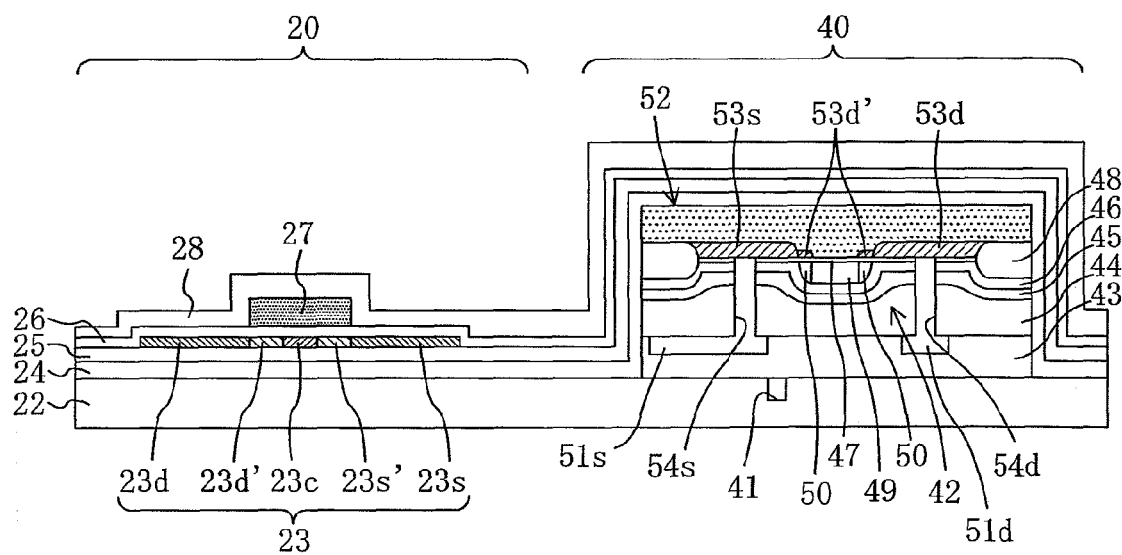
FIG. 5 is a cross-sectional view of the glass substrate on which a protective film is formed.

Next, as shown in FIG. 5, the gate insulating film 26 and the gate electrode 27 are covered with the protective film 28.

Figure 6:
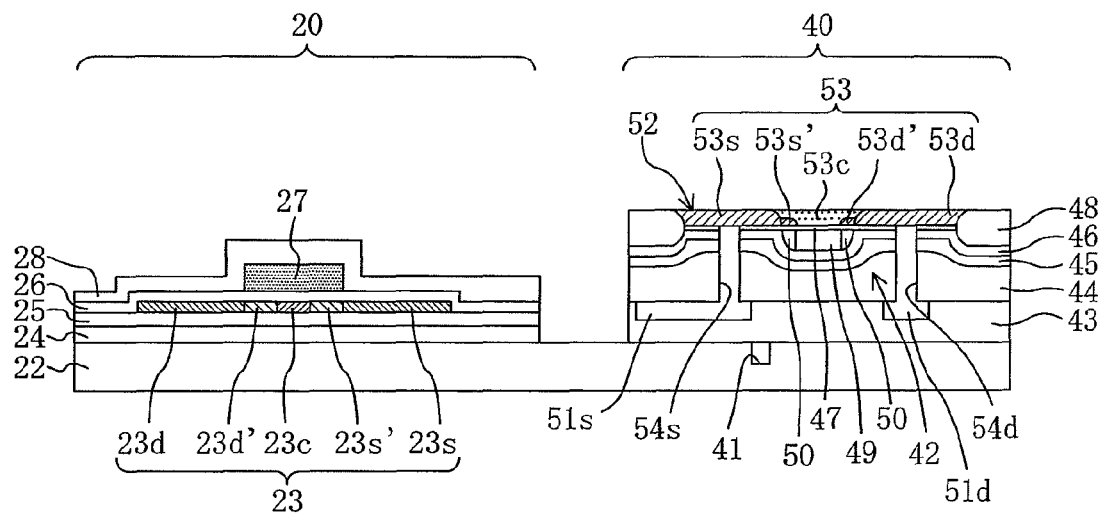
FIG. 6 is a cross-sectional view of the glass substrate on which base coat layers, a gate insulating film, and a protective film on a boundary portion between a display region and the peripheral device unit and on the peripheral device unit are removed by etching.

Next, as shown in FIG. 6, the base coat layers 24 and 25, the gate insulating film 26, and the protective film 28 on a boundary portion between the display region and the peripheral device unit 40, and on the peripheral device unit 40 are removed by etching. Moreover, by etching the semiconductor layer 52, surfaces of the LOCOS oxide film 48 and the active region 53 are exposed.

Next, as shown in FIG. 7, the TEOS film 55, the SiN film 56, and the TEOS film 57 as insulating films are formed which extend over the protective film 28 in the display region and the peripheral device unit 40.

Next, as shown in FIG. 8, the contact holes 58s, 58d, and 59s are formed. The contact holes 58s and 58d penetrate the TEOS film 55, the SiN film 56, the TEOS film 57, the protective film 28, and the gate insulating film 26 to reach the source region 23s and the drain region 23d of the semiconductor layer 23, respectively. The contact hole 59s penetrates the TEOS film 55, the SiN film 56, the TEOS film 57, the LOCOS oxide film 48, the interlayer insulating film 44, the interlayer insulating film 45, and the insulating film 46 to reach the source electrode 51s of the peripheral device unit 40.

Next, as shown in FIG. 9, the contact holes 58d, 58s, and 59s are filled with a conductive material to form the interconnection portions 60d, 60s, and 61s, respectively. Next, the passivation film 62, and the resin film 63 as a planarizing film are formed to cover the TFT 21 and the interconnection portions 60d, 60s, and 61s of the peripheral device unit 40.

A portion where the resin film 63 is not formed is provided on each of the interconnection portions 60s and 61s, and the conductive film 64 made of ITO or the like is formed which extends over the portions and a part of the resin film 63. Thus, the element substrate 11 is completely produced.

Advantages of First Embodiment

According to the first embodiment, because the peripheral device unit 40 is bonded directly to the glass substrate 22, there is not a film or the like interposed between the flat glass substrate 22 and the peripheral device unit 40. Therefore, the glass substrate 22 and the peripheral device unit 40 are satisfactorily attached to each other. Moreover, because a sacrificial film or the like is not formed on the glass substrate 22, the manufacturing efficiency of the device is satisfactorily high. Moreover, because the peripheral device unit 40 is bonded to the glass substrate 22 before the thin film device unit 20 is formed, there is not residue of a sacrificial film or the like on the glass substrate 22 before the peripheral device unit 40 is bonded to the glass substrate 22, and therefore, warpage due to a thermal treatment or the like does not occur. Therefore, the peripheral device unit 40 can be bonded to a flatter surface of the glass substrate 22. As a result, the glass substrate 22 and the peripheral device unit 40 are more satisfactorily attached to each other.

Moreover, because the alignment mark 41 for formation of the peripheral device unit 40 is provided on the glass substrate 22 before the peripheral device unit 40 is bonded to the glass substrate 22, the peripheral device unit 40 can be bonded to the glass substrate 22 with high accuracy and efficiency.

Moreover, because the thin film device unit 20 includes the TFTs 21 including an amorphous silicon semiconductor layer or a polycrystalline silicon semiconductor layer, the thin film device unit 20 has good qualities, such as a faster response time of the TFT 21 and the like.

Moreover, because the peripheral device unit 40 includes the semiconductor layer 52 made of monocrystalline silicon, the peripheral device unit 40 has good qualities, such as a higher carrier mobility of the semiconductor layer 52 and the like.

Second Embodiment

Next, a second embodiment of the present invention will be described. The second embodiment has a feature that a planarizing film is provided at a step portion between a thin film device unit and a peripheral device unit.

FIGS. 11-17 are cross-sectional views for describing an element substrate 111 which is a semiconductor device, in the order in which the element substrate 111 is manufactured.

Method for Manufacturing Device Substrate 111

Figure 11:
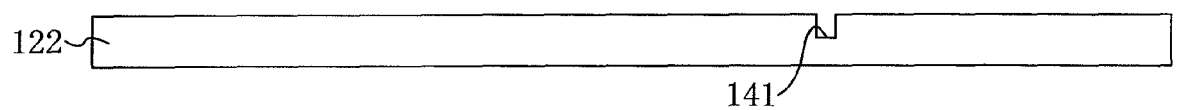
FIG. 11 is a cross-sectional view of a glass substrate according to a second embodiment on which an alignment mark is formed.

Initially, as shown in FIG. 11, a glass substrate 122 is prepared, and an alignment mark 141 for positioning during formation of a peripheral device unit is formed on a surface of the glass substrate 122.

Moreover, in a separate step, a peripheral device unit 140 which is to be bonded to the glass substrate 122 is produced. The peripheral device unit 140 is produced and configured in a manner similar to that of the peripheral device unit 40 of the first embodiment. Therefore, in FIGS. 12-17, reference characters for the components of the peripheral device unit 140 are not shown.

The peripheral device unit 140 is formed in a manner similar to that of the first embodiment, and is bonded to the glass substrate 22 in accordance with the alignment mark 141. Thereafter, the resultant structure is subjected to a thermal treatment at a temperature of about 400-600° C. to separate a portion of the semiconductor substrate including a P-well region along a release layer.

Figure 12:
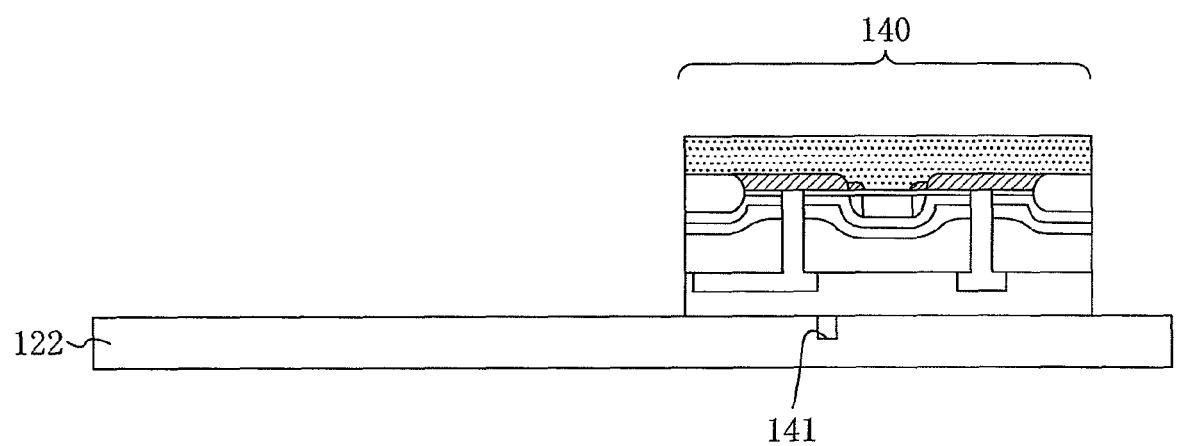
FIG. 12 is a cross-sectional view of the glass substrate to which a peripheral device unit is bonded.

Thus, as shown in FIG. 12, the peripheral device unit 140 is formed on the glass substrate 122 before a thin film device unit 120 is formed.

Figure 13:
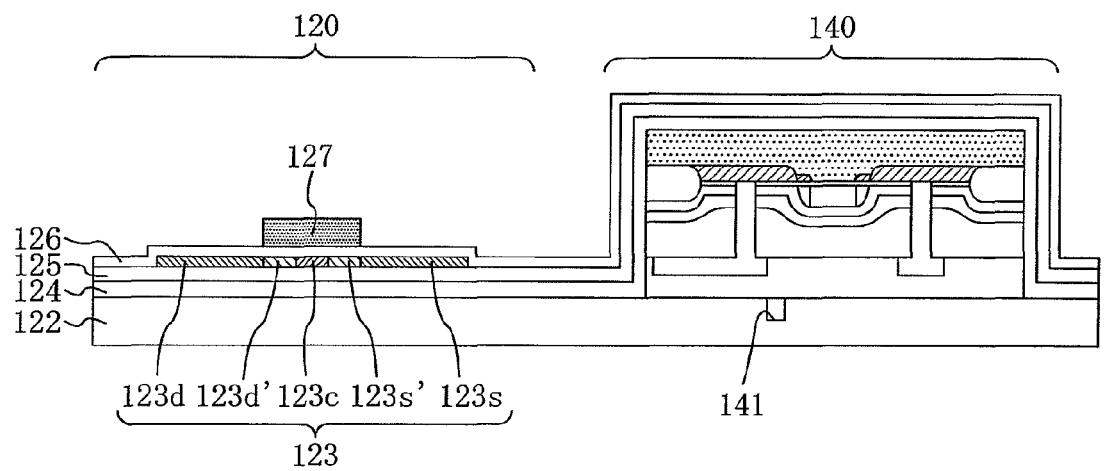
FIG. 13 is a cross-sectional view of the glass substrate on which a gate electrode is formed.

Next, as shown in FIG. 13, base coat layers 124 and 125 are formed on a display region of the glass substrate 122 and on the peripheral device unit 140 in a peripheral region of the glass substrate 122. Moreover, a semiconductor layer 123 is formed on the base coat layer 125. The semiconductor layer 123 includes a channel region 123c, LDD regions 123s' and 123d' formed on opposite sides of the channel region, and a source region 123s and a drain region 123d between which the channel region 123c and the LDD regions 123s' and 123d' are interposed. Next, a gate insulating film 126 is formed on the base coat layer 125 and the semiconductor layer. Moreover, a gate electrode 127 is formed in a display region of the gate insulating film 126 by patterning using photolithography.

Figure 14:
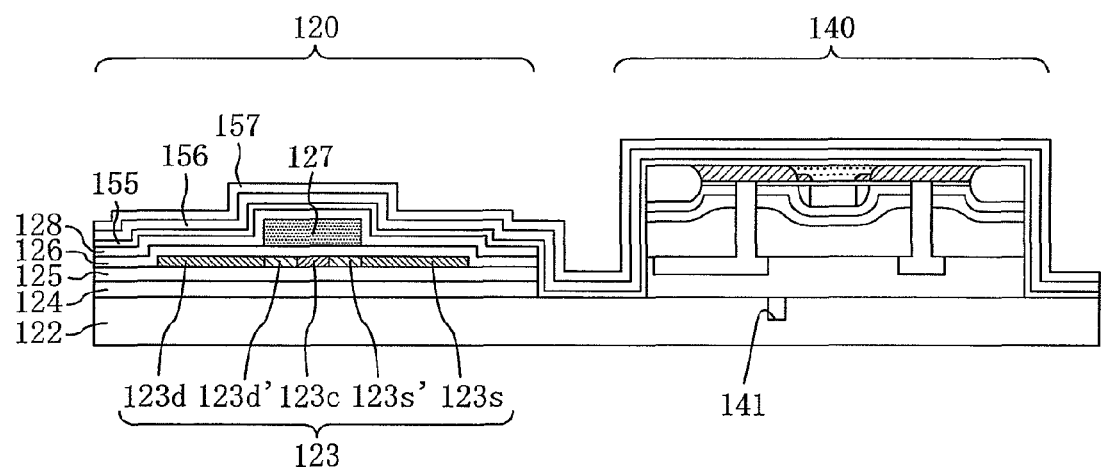
FIG. 14 is a cross-sectional view of the glass substrate on which a SiN film is formed.

Next, as shown in FIG. 14, the gate insulating film 126 and the gate electrode 127 are covered with a protective film 128. Next, the base coat layers 124 and 125, the gate insulating film 126, and the protective film 128 on a boundary portion between the display region and the peripheral device unit 140, and on the peripheral device unit 140 are removed by etching. Moreover, the semiconductor layer of the peripheral device unit 140 is etched to expose surfaces of the LOCOS oxide film and the active region. Next, a TEOS film 155, a SiN film 156, and a TEOS film 157 as insulating films are formed which extend over the protective film 128 in the display region and the peripheral device unit 140.

Figure 15:
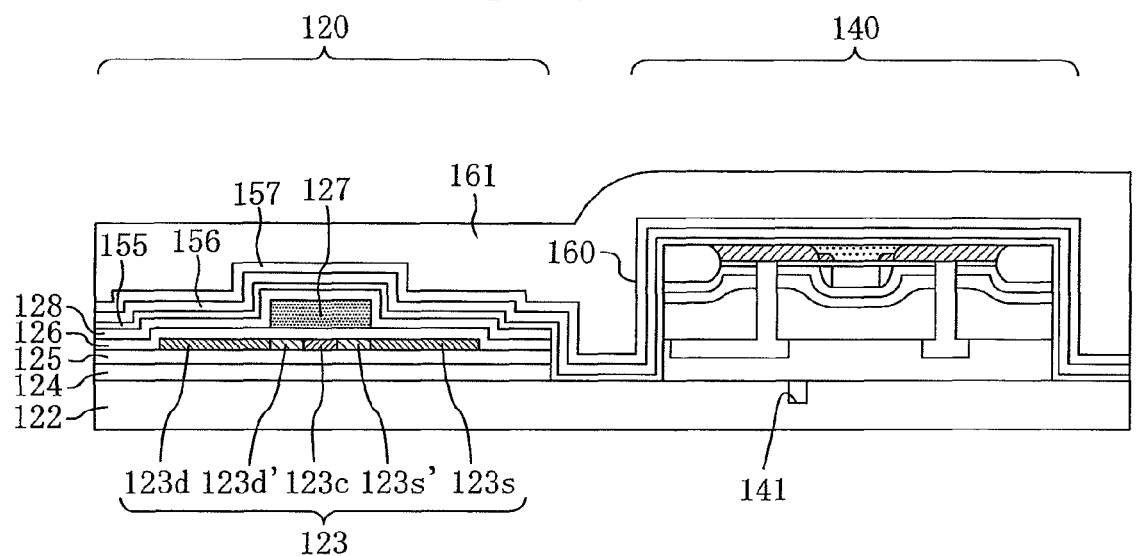
FIG. 15 is a cross-sectional view of the glass substrate on which a planarizing film is formed.

Next, as shown in FIG. 15, a planarizing film 161 made of a resin material is formed which extends over the thin film device unit 120, a step portion 160 between the thin film device unit 120 and the peripheral device unit 140, and the peripheral device unit 140.

Figure 16:
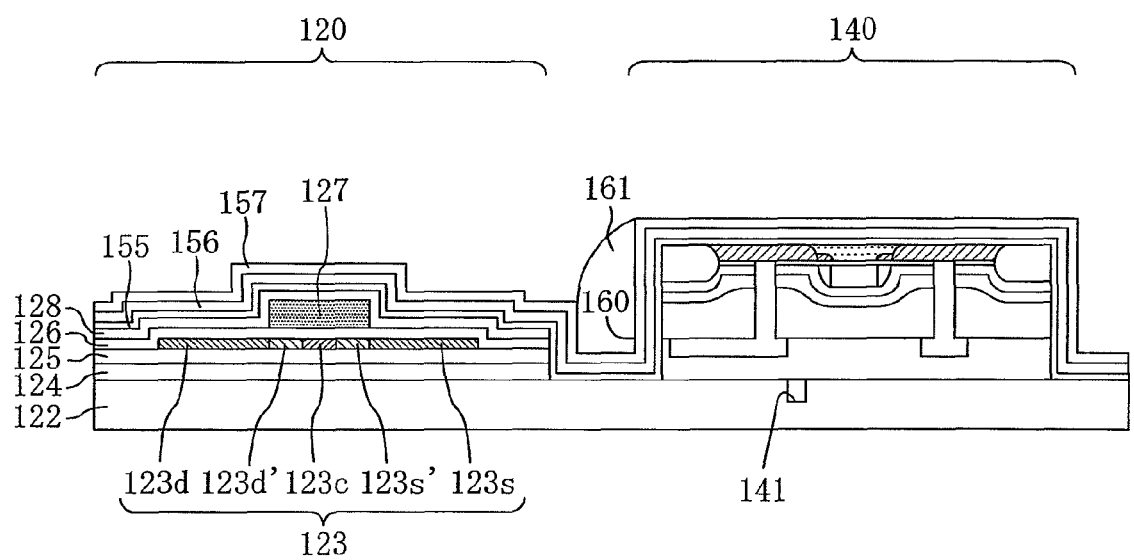
FIG. 16 is a cross-sectional view of the glass substrate on which the planarizing film is etched.

Next, as shown in FIG. 16, all the planarizing film 161 is removed by etching, except for a region thereof corresponding the step portion 160. As a result, the step portion 160 between the thin film device unit 120 and the peripheral device unit 140 is filled and planarized with the planarizing film 161.

Figure 17:
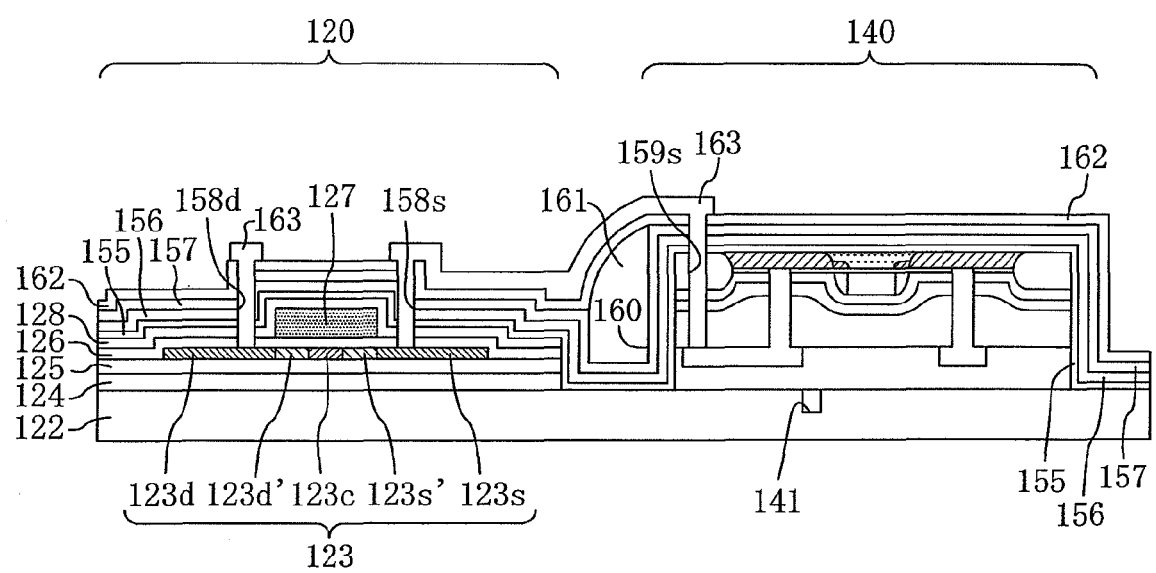
FIG. 17 is a cross-sectional view of an element substrate according to the second embodiment.

Next, as shown in FIG. 17, an insulating film 162 is formed which extends over the thin film device unit 120, the planarizing film 161, and the peripheral device unit 140. Next, contact holes 158s, 158d, and 159s are formed. The contact holes 158s and 158d penetrate the TEOS film 157, the SiN film 156, the TEOS film 155, the protective film 128, and the gate insulating film 126 to reach the source region 123s and the drain region 123d of the semiconductor layer 123, respectively. The contact hole 159s penetrates the TEOS film, the SiN film, the TEOS film, the LOCOS oxide film, the interlayer insulating film, and the insulating film to reach the source electrode of the peripheral device unit 140. Next, a conductive material is provided in the contact holes 158s, 158d, and 159s, and on the insulating film 162 before a predetermined etching treatment is performed. As a result, a metal interconnection 163 for electrically connecting the thin film device unit 120 and the peripheral device unit 140 is formed. Moreover, various steps are performed to produce the element substrate 111 including a plurality of TFTs which are provided in a matrix on the substrate.

Advantages of Second Embodiment

According to the second embodiment, the element substrate 111 has advantages similar to those of the first embodiment. Moreover, because the planarizing film 161 is formed on the step portion 160, it is possible to satisfactorily reduce or prevent damage to an interconnection, a layer, and the like which extend over the thin film device unit 120 and the peripheral device unit 140.

Moreover, in the second embodiment, the metal interconnection 163 for electrically connecting the thin film device unit 120 and the peripheral device unit 140 is formed on the planarizing film 161. Therefore, the metal interconnection 163 is not affected by the step portion 160. As a result, the occurrence of a disconnection or the like of the metal interconnection 163 due to bending or the like can be satisfactorily reduced or prevented.

Moreover, because the planarizing film 161 is formed of a resin material, the planarizing film 161 which flexibly fits the shape of the step portion 160 can be formed, resulting in a more satisfactory flatness of the step portion 160.

While, in the first and second embodiments, the glass substrates 22 and 122 are used as substrates, the present invention is not limited to this, and any substrate that has an insulating surface may be employed. For example, a plastic substrate, a quartz substrate, or the like may be employed.

Moreover, the peripheral device units 40 and 140 of the first and second embodiments may be any one that can be provided around the thin film device units 20 and 120 and has a semiconductor element. Examples of such a peripheral device unit include high-performance devices and the like required for system integration, such as drivers, and memories, microprocessors, image processors, timing controllers, and the like for which higher performance is required.

Moreover, while, in the second embodiment, the planarizing film 161 is formed of a resin material, the present invention is not limited to this. For example, the planarizing film 161 may be formed of a spin-on-glass (SOG) material or the like. Here, the SOG material is one that is used as an insulating film or a planarization material in some processes. The SOG material is a solution which is obtained by dissolving a silicate compound in an organic solvent. By using the SOG material, a film including silicate glass ($SiO_2$) as a major component can be formed.

INDUSTRIAL APPLICABILITY

As described above, the present invention is useful for semiconductor device manufacturing methods and semiconductor devices.

The invention claimed is:
1. A semiconductor device comprising:
a substrate having an insulating surface;

a thin film device unit provided on the substrate;

a peripheral device unit provided on the substrate around the thin film device unit, and including a semiconductor element;

a step portion formed between the thin film device unit and the peripheral device unit;

a planarizing film formed only in a region corresponding to the step portion;

a metal interconnection formed on the planarizing film, for electrically connecting the thin film device unit and the peripheral device unit, wherein the peripheral device unit is provided directly on the insulating surface of the substrate.

2. The semiconductor device of claim 1, wherein the planarizing film is formed of a resin or SOG.

3. The semiconductor device of claim 1, wherein the substrate having the insulating surface is made of glass, plastic, or quartz.

\* \* \* \* \*